(12) United States Patent
Choi

(10) Patent No.: US 7,171,508 B2
(45) Date of Patent: Jan. 30, 2007

(54) DUAL PORT MEMORY WITH ASYMMETRIC INPUTS AND OUTPUTS, DEVICE, SYSTEM AND METHOD

(75) Inventor: Joo S. Choi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 169 days.

(21) Appl. No.: 10/925,255

(22) Filed: Aug. 23, 2004

(65) Prior Publication Data

US 2006/0041704 A1     Feb. 23, 2006

(51) Int. Cl.
G06F 13/36  (2006.01)
G06F 13/40  (2006.01)

(52) U.S. Cl. .................. 710/307; 710/308
(58) Field of Classification Search ............ 710/307, 710/308
See application file for complete search history.

(56) References Cited

U.S. PATENT DOCUMENTS

| | | | |
|---|---|---|---|
| 4,623,990 A | 11/1986 | Allen et al. | |
| 4,796,232 A | 1/1989 | House | |
| 5,235,543 A | 8/1993 | Rosen | |
| 5,293,491 A | 3/1994 | Leung et al. | |
| 5,327,386 A | 7/1994 | Fudeyasu | |
| 5,463,591 A | 10/1995 | Aimoto et al. | |
| 5,579,484 A | 11/1996 | Cooper | |
| 5,630,106 A | 5/1997 | Ishibashi | |
| 5,802,603 A | 9/1998 | Bains et al. | |
| 5,923,608 A | 7/1999 | Payne | |
| 5,966,736 A | 10/1999 | Gittinger et al. | |
| 6,020,904 A | 2/2000 | Clark | |
| 6,088,761 A | 7/2000 | Aybay | |
| 6,138,204 A | 10/2000 | Amon et al. | |
| 6,173,353 B1 | 1/2001 | Butcher | |
| 6,212,543 B1 | 4/2001 | Futral | |
| 6,247,084 B1 | 6/2001 | Apostol, Jr. et al. | |
| 6,272,577 B1 | 8/2001 | Leung et al. | |
| 6,418,495 B1 | 7/2002 | Ryan | |
| 6,545,935 B1 | 4/2003 | Hsu et al. | |
| 6,779,075 B2 * | 8/2004 | Wu et al. ................ 711/105 |
| 6,801,869 B2 * | 10/2004 | McCord ................ 702/117 |
| 2002/0023191 A1 * | 2/2002 | Fudeyasu ................ 711/104 |
| 2002/0112119 A1 | 8/2002 | Halbert et al. | |
| 2002/0165985 A1 | 11/2002 | Chen et al. | |
| 2002/0174298 A1 | 11/2002 | Hsu et al. | |
| 2003/0023823 A1 | 1/2003 | Woo et al. | |
| 2003/0070052 A1 | 4/2003 | Lai | |
| 2003/0212859 A1 | 11/2003 | Ellis et al. | |
| 2004/0008054 A1 | 1/2004 | Lesea et al. | |

* cited by examiner

*Primary Examiner*—Rehana Perveen
*Assistant Examiner*—Jeremy S. Cerullo
(74) *Attorney, Agent, or Firm*—TraskBritt, PC

(57) ABSTRACT

An asymmetric memory interface including an asymmetric read data interface having a read bus width configured to transfer data from a memory device to a memory controller. The asymmetric memory interface further includes an asymmetric write data interface having a write bus width configured to transfer data from the memory controller to the memory device with the write bus width being different from the read bus width. A memory system including the asymmetric memory interface, memory controller and memory device is disclosed. The asymmetric nature of inputs and outputs reduces pin count by avoiding symmetric replication of bus widths for inputs and outputs. A method of accessing data in a memory device is also disclosed.

29 Claims, 6 Drawing Sheets

DUAL PORT MEMORY WITH ASYMMETRIC INPUTS AND OUTPUTS, DEVICE, SYSTEM AND METHOD

BACKGROUND OF THE INVENTION

1. Field of the Invention

The present invention relates to a device interface and, more specifically, to systems and methods for improved matching of interfaces with data flow.

2. State of the Art

Interfaces provide access points for exchanging data within electronic or computer systems. An example of an interface includes the access points associated with, for example, a memory device. Generally, a memory device includes a specific number of pins that are dedicated or at least shared for accessing and storing information within memory locations of a memory device. To minimize the number of dedicated pins for an interface, access points that function both as data inputs and outputs have been developed. FIG. 1 illustrates a pair of devices coupled together according to a shared interface. While electronic devices may incorporate various form factors, the present illustration is drawn to data storage and, more particularly, to memory devices. An interface system 10 includes a memory controller 12 coupled to a memory device 14 according to a bidirectional interface 16. Bidirectional interface 16 combines both the "D" inputs and "Q" outputs of memory device 14 into shared pins to reduce the overall interface pin count, X.

While the pin count of a memory device may be reduced through the use of a bidirectional interface, such a functionally shared interface creates a throughput-bottleneck when, for example, a memory controller and memory device are capable of generating memory access commands for reading and writing to a memory device that is capable of responding thereto in a generally simultaneous manner.

In response to increased memory bandwidth demands, separate input and output interfaces have been proposed and implemented. FIG. 2 illustrates an interface system 20 including a memory controller 22 coupled to a memory device 24 according to a separate symmetric interface 26. Separate symmetric interface 26 includes a symmetric read data interface 28 and a symmetric write data interface 30. Each of the interfaces, symmetric read data interface 28 and symmetric write data interface 30, include an equivalent number of pins, X for interfacing with memory device 24. Separating the read and write data interfaces provides improved performance including signal integrity, no bus turn-around time, reduced I/O capacitance, etc. However, doubling of interface pins resulting from separating the read and write data interfaces creates an increased interface dimension for memory device 24, which increases the overall area required for integrating memory device 24 into an electronic system. Therefore, there is a need to provide an improved device interface while reducing the overall affect to the form factor of the device and overall system.

BRIEF SUMMARY OF THE INVENTION

The present invention is directed to a dual port memory with asymmetric inputs and outputs. In one embodiment of the present invention, an asymmetric memory interface is provided. The asymmetric memory interface includes an asymmetric read data interface having a read bus width configured to transfer data from a memory device to a memory controller. The asymmetric memory interface further includes an asymmetric write data interface having a write bus width configured to transfer data from the memory controller to the memory device with the write bus width different in size from the read bus width.

In another embodiment of the present invention, a memory system is provided. The memory system includes a memory controller and memory device. An asymmetric interface couples the memory controller with the memory device. The asymmetric interface includes an asymmetric read data interface of a read bus width configured to transfer data from the memory device to the memory controller and an asymmetric write data interface of a write bus width configured to transfer data from the memory controller to the memory device. The write bus width is configured to be different in width from the read bus width.

In a further embodiment of the present invention, a memory device is provided. The memory device includes a memory array and an interface configured to operably couple with an asymmetric interface for coupling a memory controller with the memory device. The interface includes an asymmetric read data interface of a read bus width configured to transfer data from the memory device to the memory controller and an asymmetric write data interface of a write bus width configured to transfer data from the memory controller to the memory device. The write bus width is different from the read bus width.

In yet a further embodiment of the present invention, an electronic system is provided. The electronic system includes a processor device, a memory controller coupled to the processor device and an asymmetric memory interface. The asymmetric memory interface includes an asymmetric read data interface of a read bus width configured to transfer data from a memory device to a memory controller and an asymmetric write data interface of a write bus width configured to transfer data from the memory controller to the memory device, the write bus width being different from the read bus width.

In an additional embodiment of the present invention, a method of accessing data in a memory device is provided. A memory controller writes data over an asymmetric write data interface of a write bus width to a memory device. The data is stored in the memory device. The data is read from the memory device over an asymmetric read data interface of a read bus width to the memory controller. The write bus width is different from the read bus width.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

Advancements in integrated circuits generally include miniaturization of circuits and, more particularly, a reduction in the physical line dimensions of the individual printed circuits. While the physical area of a specific integrated circuit may periodically be reduced, the inputs and outputs (I/Os) associated therewith must still retain a form factor that enables the I/Os to be routed to pins on the package for further coupling with other devices via a printed wiring board or the like. Frequently the packaging dimension becomes the limiting factor in further miniaturization of the device.

Additionally, as devices become smaller and functionality increases, there is a demand for additional bandwidth access to and from the device. Specifically, for devices that are configured as a memory device, there is a desire to improve the bandwidth for writing data to the memory device, as well as the desire to improve the bandwidth for reading data from the memory device. One approach for expanding the bandwidth has included expanding the width of the bus delivering and retrieving data from the memory device. While such an approach does in fact result in an increased data bandwidth, the additional width of the data bus (e.g., reading and writing buses) results in a dramatic increase in the packaging size of the device due to the increased number of pins.

The various embodiments of the present invention expand the available bandwidth by separating the interfaces into a separate interface at, for example, a memory device for receiving data from a memory controller during a write operation and for transmitting data from the memory device during a read operation as referenced from the perspective of the memory device. In addition to increasing data bandwidth, by separating the interfaces, the impedance loading of the individual I/Os are reduced since a typical driver for transmitting data exhibits an approximately 35% increase in loading, which when coupled as a shared or bidirectional interface, results in a reduction in speed for writing data to the memory device due to the additional impedance loading of the combined interface. The various embodiments of the present invention also reduce the form factor or area impact resulting from otherwise increasing all the I/O proportionally. The various embodiments of the present invention recognize that, for example, memory devices are read from more predominantly than they are written to. Specifically, a memory device, in many applications, is read from approximately four times more often than it is written to. Therefore, the separate interfaces are asymmetrically expanded, rather than symmetrically or proportionally expanded.

Figure 1:
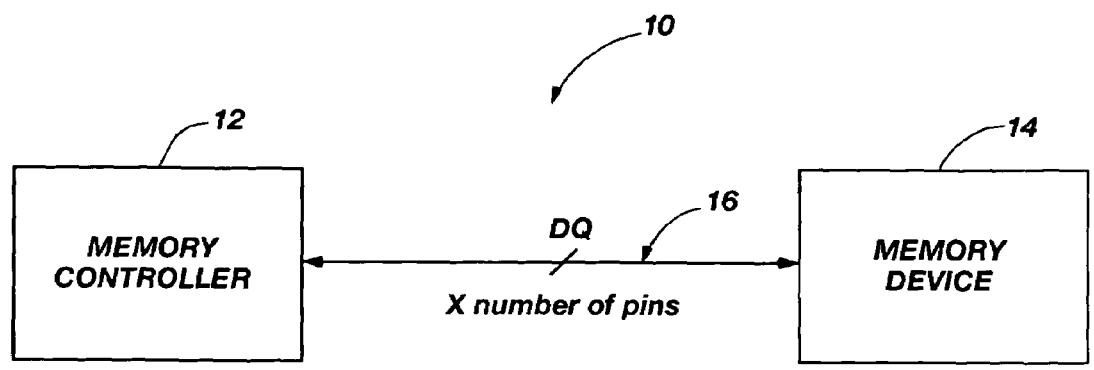
FIG. 1 is a block diagram of a memory controller and a memory device coupled via a bidirectional interface.
Figure 2:
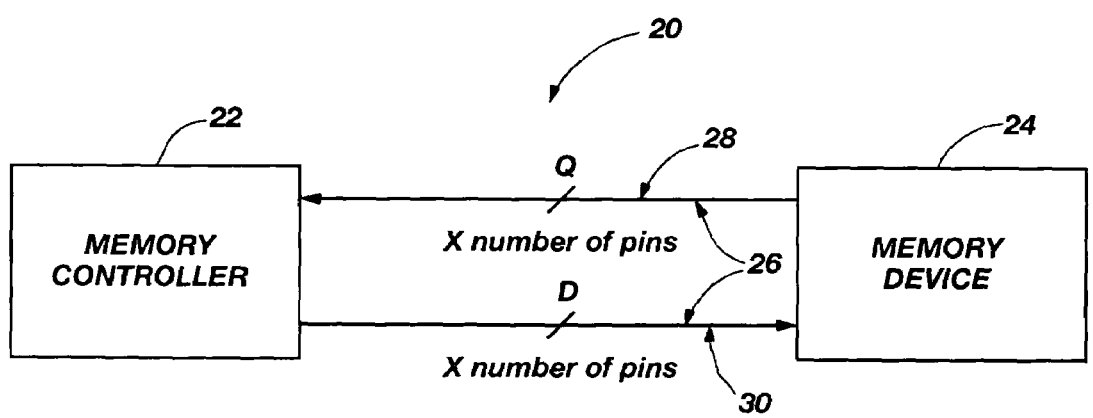
FIG. 2 is a block diagram of a memory controller and a memory device coupled via a separate symmetric interface.
Figure 3:
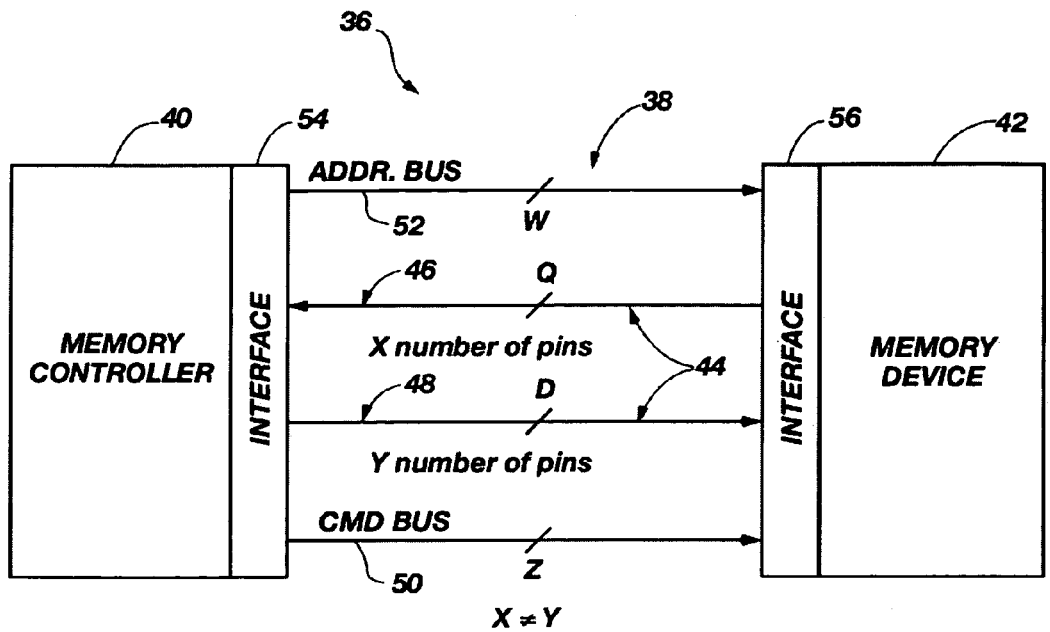
FIG. 3 is a block diagram of a memory controller and a memory device coupled via a separate asymmetric interface, in accordance with an embodiment of the present invention.

FIG. 3 is a block diagram of a memory controller and a memory device coupled via a separate asymmetric interface, in accordance with an embodiment of the present invention. A memory system 36 includes a memory controller 40 coupled to a memory device 42 according to an interface system 38, which includes a separate asymmetric interface 44. Separate asymmetric interface 44 includes an asymmetric read data interface 46 and an asymmetric write data interface 48. The asymmetry of interfaces 46 and 48 is a result of a difference in the width of the interface dimensions, namely the difference in the number of the drivers and receivers of the memory device, which further corresponds to a difference in the number of pins X and Y associated with the respective interfaces. By way of example and not limitation, the asymmetry may follow a memory device access methodology and include a narrower asymmetric write data interface 48 for writing data to memory device 42 and wider asymmetric read data interface 46 for reading data from memory device 42. Memory controller 40 and memory device 42 further include respective interfaces 54, 56 configured to provide the physical interface layer, as well as any multiple data rate methodologies incorporated therein.

Interface system 38 of FIG. 3 further includes a command bus 50 of width/pins Z and an address bus 52 of width/pins W. The specifics and operational configuration of command and address buses 50, 52 function according to conventional command and address specifications known by those of ordinary skill in the art. Addressing may include the request for multiple data words or blocks of data words for use in data-intensive applications, such as graphic or video processing. Furthermore, memory controller 40 and memory device 42 may be configured to operate using additional data rate techniques.

Figure 4:
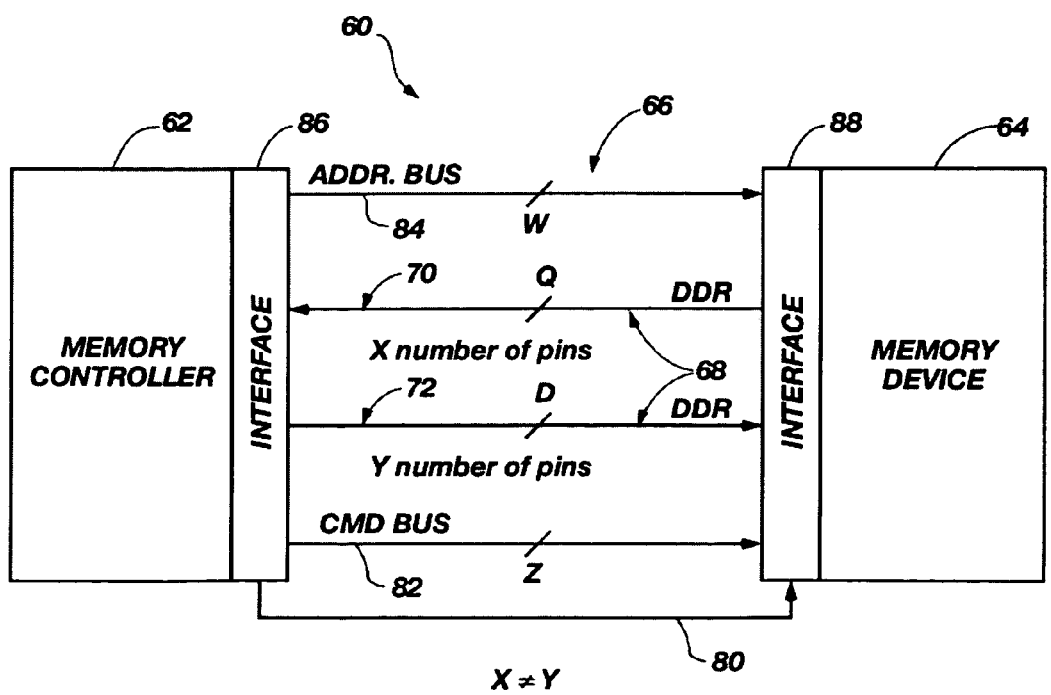
FIG. 4 is a block diagram of a memory controller and a double data rate memory device coupled via a separate asymmetric interface, in accordance with an embodiment of the present invention.

FIG. 4 is a block diagram of a memory system including a memory controller and a double data rate memory device coupled via a separate asymmetric interface, in accordance with an embodiment of the present invention. A memory system 60 includes a memory controller 62 and a memory device 64 coupled together according to an interface system 66. In this exemplary embodiment of the of the present invention, memory device 64 is configured as a Dual Data Rate (DDR) memory device configured to read and/or write two pieces of data on each clock cycle. Specifically, DDR memory devices read or write a first piece of data on one edge of the clock and read or write another piece of data on the opposite edge of the clock. Interface system 66 includes a separate asymmetric interface 68 comprised of an asymmetric read data interface 70 and an asymmetric write data interface 72. Separate asymmetric read and write interfaces 70, 72 are configured, in one embodiment, with asymmetry according to a memory device access methodology that includes a narrower asymmetric write data interface 72 for writing data to memory device 64 and wider asymmetric read data interface 70 for reading data from memory device 64. Memory controller 62 and memory device 64 further include respective interfaces 86, 88 configured to provide the physical interface layer, as well as any multiple data rate methodologies, such as DDR techniques, incorporated therein.

In the present embodiment of the present invention, memory controller 62 and memory device 64 are configured to exchange data according to a DDR methodology. While FIG. 4 illustrates DDR capability on both the asymmetric read and write interfaces 70, 72, it is also known that the loading of a memory device driver is greater than the loading of a memory device receiver. Accordingly, the performance of writing to a memory device may practically operate at a higher switching rate than the reading operation of the memory device over an asymmetric read data interface. Therefore, it is further contemplated that a memory system may be configured such that only one of the interfaces operates according to dual or other multi-rate techniques, while the other interface operates at a different data rate.

Figure 5:
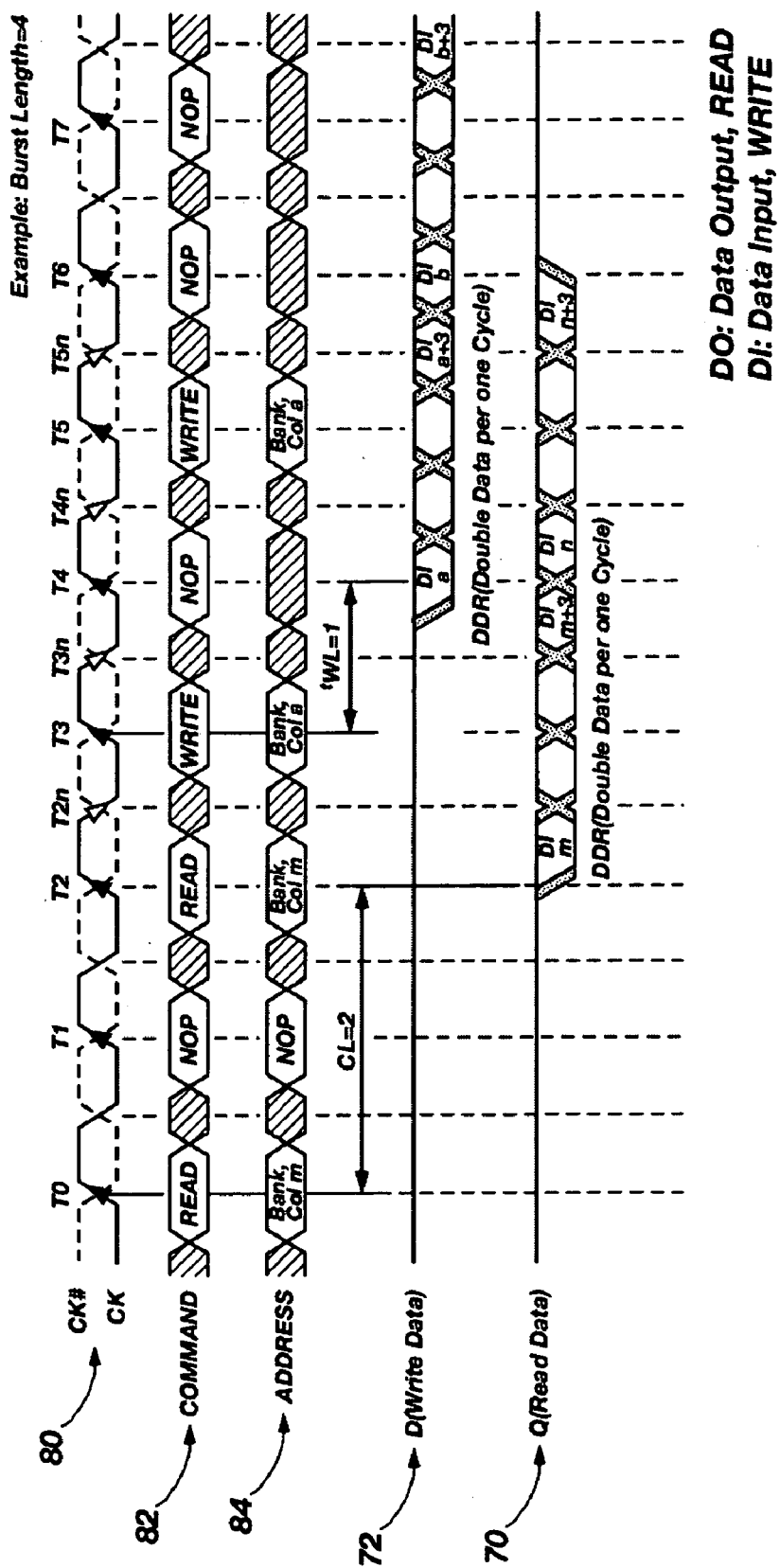
FIG. 5 is a timing diagram of a memory controller and a double data rate memory device coupled via a separate asymmetric interface, in accordance with an embodiment of the present invention.

FIG. 5 is a timing diagram of a memory controller and a double data rate (DDR) memory device coupled via a separate asymmetric interface, in accordance with an embodiment of the present invention. Clock signals CK and CK# 80 illustrate a clock interface for synchronizing the exchange of signals between the memory controller 62 (FIG. 4) and the memory device 64 (FIG. 4). The timing diagram of FIG. 5 further illustrates a command bus 82 including an exemplary string of read, write and No-OPeration (NOP) commands and further illustrates the accompanying address locations as presented on address bus 84. Those skilled in the art appreciate that DDR memory devices read and/or write data on each edge of the clock signal. As stated, because of the separate asymmetric read and write data interfaces 70, 72, data may be simultaneously exchanged over the separate interfaces as illustrated in FIG. 5. Because of the difference in the width of the asymmetric read data interface 70 and the generally narrower asymmetric write data interface 72, when the write data interface is configured as a smaller width bus, then the effective bandwidth of the asymmetric read data interface 70 is greater than the effective bandwidth of the asymmetric write data interface 72. The difference in bandwidth is acceptable because of the statistical reality that data is generally read at a much greater frequency than it is written.

Figure 6:
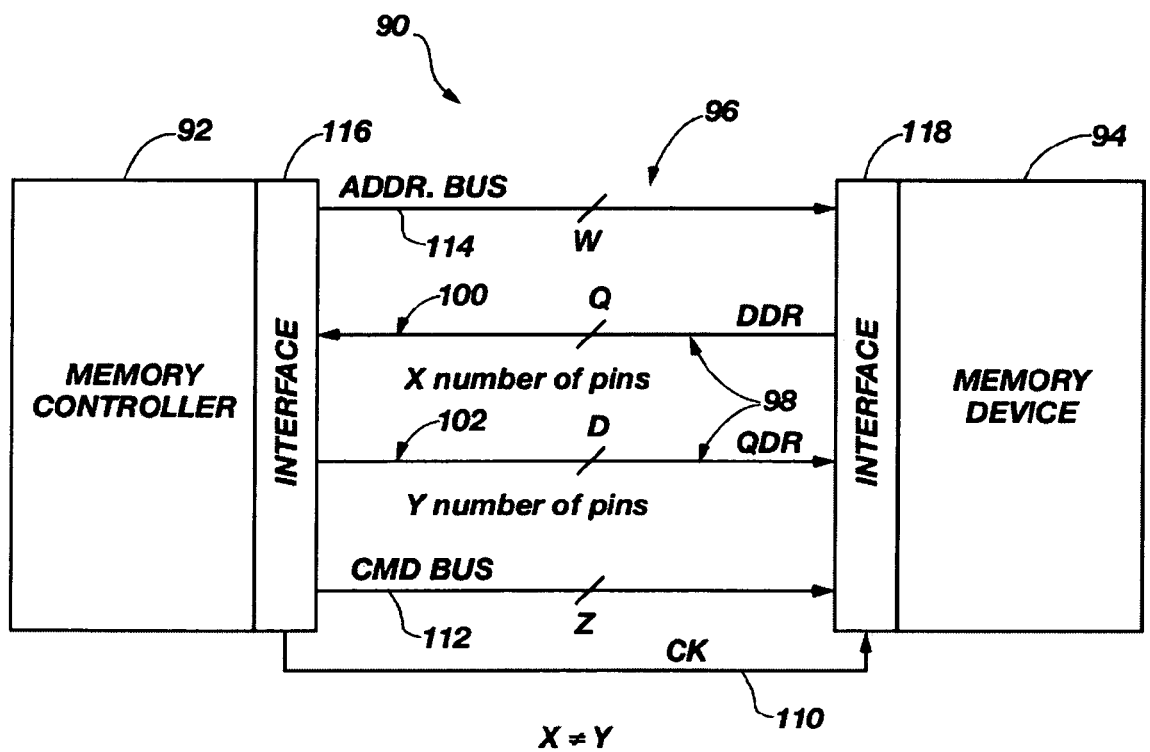
FIG. 6 is a block diagram of a memory controller and a quad data rate memory device coupled via a separate asymmetric interface, in accordance with an embodiment of the present invention.

FIG. 6 is a block diagram of a memory controller and a quad data rate memory device coupled via a separate asymmetric interface, in accordance with an embodiment of the present invention. A memory system 90 includes a memory controller 92 and a memory device 94 coupled together according to an interface system 96. In this exemplary embodiment of the present invention, memory device 94 is configured as a multi-data rate memory device, which is configured to write data at a Quadrature Data Rate (QDR) and to read data at a Double Data Rate (DDR). The QDR capability means that for each complete cycle of the clock, valid data is written on four separate occasions during one complete clock cycle. The DDR capability means that for each complete cycle of the clock, valid data is read on two separate occasions during one complete clock cycle. Interface system 96 includes a separate asymmetric interface 98 comprised of an asymmetric read data interface 100 and an asymmetric write data interface 102. Separate asymmetric read and write data interfaces 100, 102 are configured, in one embodiment, with asymmetry according to a memory device access methodology that includes a narrower asymmetric write data interface 102 for writing data to memory device 94 and wider asymmetric read data interface 100 for reading data from memory device 94. Memory controller 92 and memory device 94 further include respective interfaces 116, 118 configured to provide the physical interface layer, as well as any multiple data rate methodologies, such as DDR/QDR techniques, incorporated therein. In the present embodiment of the present invention, memory controller 92 and memory device 94 are configured to exchange data according to a QDR/DDR methodology.

Figure 7:
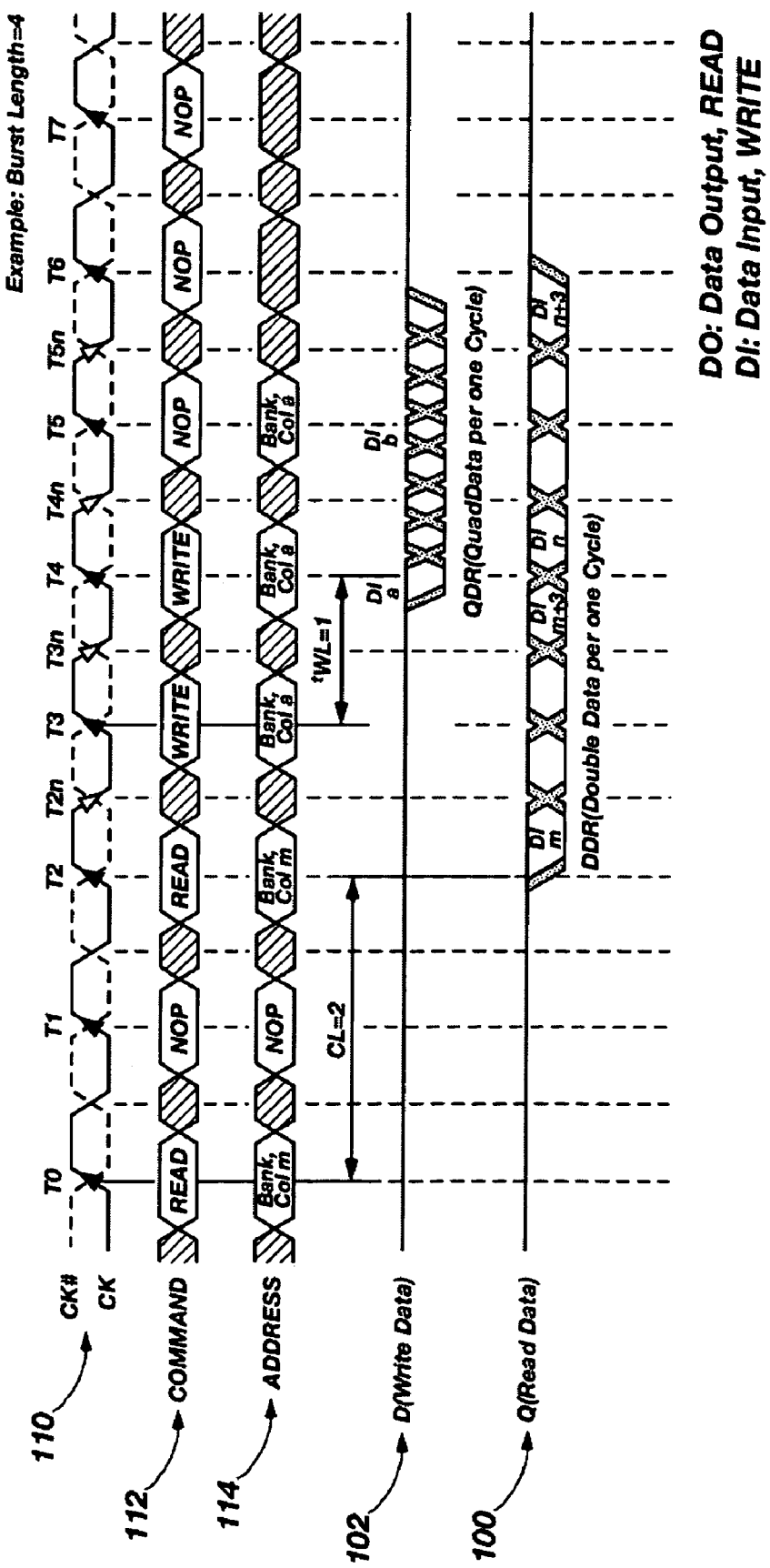
FIG. 7 is a timing diagram of a memory controller and a quad data rate memory device coupled via a separate asymmetric interface, in accordance with an embodiment of the present invention.

FIG. 7 is a timing diagram of a memory controller and a QDR/DDR memory device coupled via a separate asymmetric interface, in accordance with an embodiment of the present invention. Clock signals CK and CK# 110 illustrate a clock interface for synchronizing the exchange of signals between the memory controller 92 (FIG. 6) and the memory device 94 (FIG. 6). The timing diagram of FIG. 7 further illustrates a command bus 112 including an exemplary string of read, write and No-OPeration (NOP) commands and further illustrates the accompanying address locations as presented on address bus 114. Those skilled in the art appreciate that QDR memory devices write data four times on each clock cycle. As stated, because of the separate asymmetric read and write data interfaces 100, 102, data may be simultaneously exchanged over the separate interfaces as illustrated in FIG. 7. Because of the difference in the width of the asymmetric read data interface 100 and the generally narrower asymmetric write data interface 102, when the asymmetric write data interface 102 is configured as a smaller width bus, then the effective bandwidth of the asymmetric read data interface 100 is greater than the effective bandwidth of the asymmetric write data interface 102. The difference in bandwidth is acceptable because of the statistical reality that data is generally read at a much greater frequency than it is written. In the present embodiment of the present invention, asymmetric write data interface 102 is configured according to QDR principles resulting in an augmentation of the overall bandwidth of the asymmetric write data interface 102.

Figure 8:
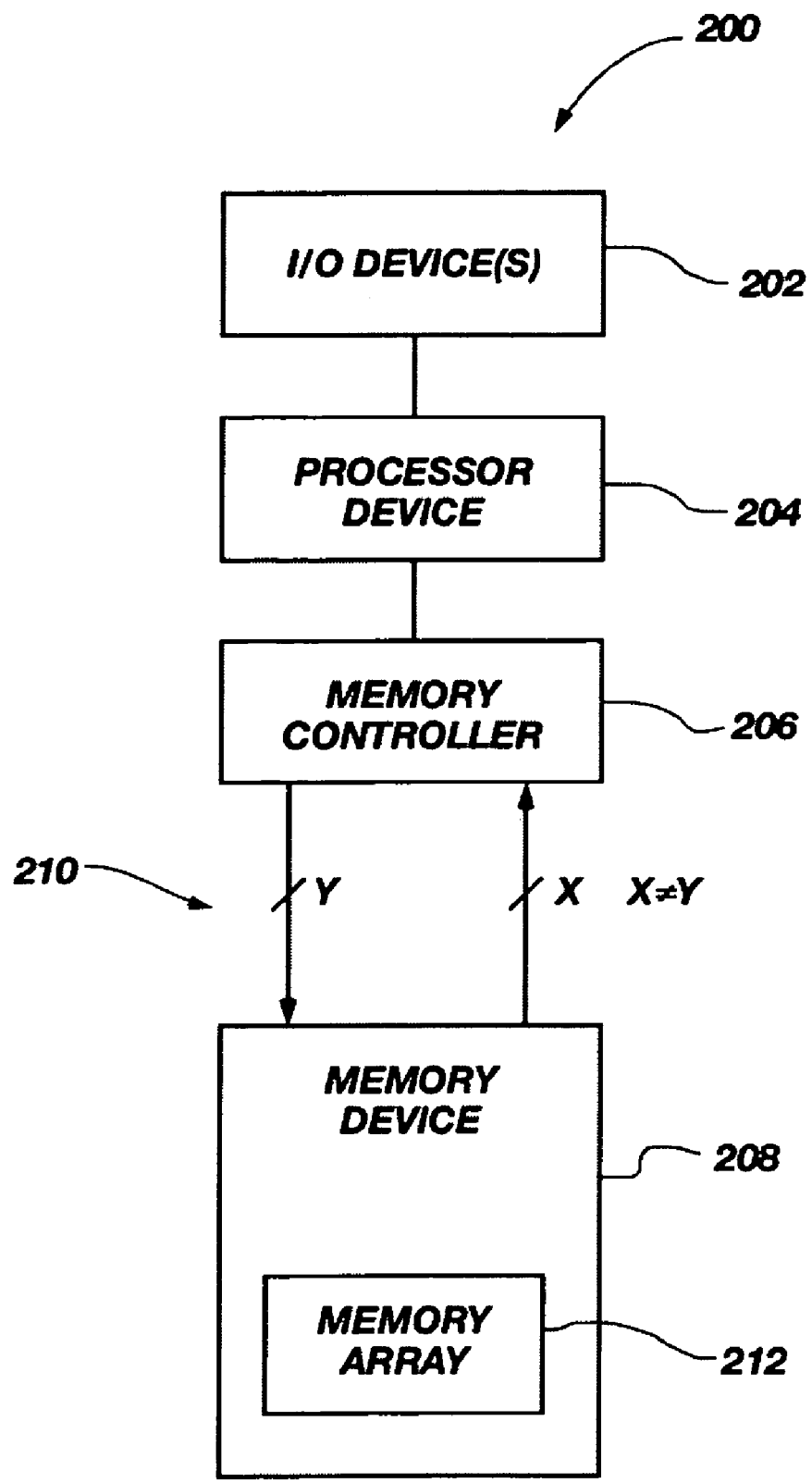
FIG. 8 is a block diagram of an electronic system including a memory controller and a memory device coupled via a separate asymmetric interface, in accordance with an embodiment of the present invention.

FIG. 8 is a block diagram of an electronic system, including a memory controller and a memory device coupled via a separate asymmetric interface, in accordance with an embodiment of the present invention. An electronic system 200, such as a computer system, includes input and/or output devices I/O device(s) 202, a processor device 204, a memory controller 206 and a memory device 208. Memory device 208 includes a memory array 212 configured for inputting and outputting data stored therein. The memory controller 206 and memory device 208 couple via a separate asymmetric interface 210 configured according to one or more of the previously described embodiments of the present invention. Memory controller 206 and memory device 208 may be configured as a DRAM controller and DRAM device, respectively.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention includes all modifications, equivalents, and alternatives falling within the spirit and scope of the invention as defined by the following appended claims.

What is claimed is:

1. An asymmetric memory interface, comprising:
an asymmetric read data interface having a read bus width configured to transfer data from a memory device to a memory controller; and
an asymmetric write data interface having a write bus width configured to transfer data from the memory controller to the memory device, the write bus width being different from the read bus width,
wherein the asymmetric read data interface and the asymmetric write data interface transfer the data according to different multi data rate methodologies.

2. The asymmetric memory interface of claim 1, wherein the read bus width is greater in width than the write bus width.

3. The asymmetric memory interface of claim 1, wherein the asymmetric read data interface is configured to operate according to a dual data rate (DDR) methodology.

4. The asymmetric memory interface of claim 1, wherein the asymmetric write data interface is configured to operate according to a dual data rate (DDR) methodology.

5. The asymmetric memory interface of claim 1, wherein at least one of the asymmetric read data interface and the asymmetric write data interface is configured to operate according to a quad data rate (QDR) methodology.

6. The asymmetric memory interface of claim 1, further comprising at least one of a command and address bus coupled between the memory controller and the memory device.

7. A memory system, comprising:
a memory controller;
a memory device; and
an asymmetric interface coupling the memory controller with the memory device, the asymmetric interface including:
an asymmetric read data interface of a read bus width configured to transfer data from the memory device to the memory controller; and
an asymmetric write data interface of a write bus width configured to transfer data from the memory controller to the memory device, the write bus width being different from the read bus width,
wherein the asymmetric read data interface and the asymmetric write data interface transfer the data according to different multi data rate methodologies.

8. The memory system of claim 7, wherein the read bus width is greater in width than the write bus width.

9. The memory system of claim 7, wherein the asymmetric read data interface, the memory controller and the memory device are configured to operate according to a dual data rate (DDR) methodology.

10. The memory system of claim 7, wherein the asymmetric write data interface, the memory controller and the memory device are configured to operate according to a dual data rate (DDR) methodology.

11. The memory system of claim 7, wherein the memory controller, the memory device and at least one of the asymmetric read data interface and the asymmetric write data interface are configured to operate according to a quad data rate (QDR) methodology.

12. The memory system of claim 7, further comprising at least one of a command and address bus coupled between the memory controller and the memory device.

13. A memory device, comprising:
a memory array; and
an interface configured to operably couple with an asymmetric interface for coupling a memory controller with the memory device, the interface including:
an asymmetric read data interface of a read bus width configured to transfer data from the memory device to the memory controller; and
an asymmetric write data interface of a write bus width configured to transfer data from the memory controller to the memory device, the write bus width being different from the read bus width,
wherein the asymmetric read data interface and the asymmetric write data interface transfer the data according to different multi data rate methodologies.

14. The memory device of claim 13, wherein the interface is further configured to support the asymmetric interface wherein the read bus width is greater in width than the write bus width.

15. The memory device of claim 13, wherein the interface is further configured to support the asymmetric read data interface of the asymmetric interface when configured to operate according to a dual data rate (DDR) methodology.

16. The memory device of claim 13, wherein the interface is further configured to support the asymmetric write data interface of the asymmetric interface when configured to operate according to a dual data rate (DDR) methodology.

17. The memory device of claim 13, wherein the interface is further configured to support at least one of the asymmetric write data interface and the asymmetric read data interface of the asymmetric interface when configured to operate according to a quad data rate (QDR) methodology.

18. The memory device of claim 13, wherein the interface is further configured to support at least one of a command and address bus coupled to the memory device.

19. An electronic system, comprising:
a processor device;
a memory controller coupled to the processor device; and
an asymmetric memory interface, comprising:
an asymmetric read data interface of a read bus width configured to transfer data from a memory device to the memory controller; and
an asymmetric write data interface of a write bus width configured to transfer data from the memory controller to the memory device, the write bus width being different from the read bus width,
wherein the asymmetric read data interface and the asymmetric write data interface transfer the data according to different multi data rate methodologies.

20. The electronic system of claim 19, wherein the read bus width is greater in width than the write bus width.

21. The electronic system of claim 19, wherein the asymmetric read data interface is configured to operate according to a dual data rate (DDR) methodology.

22. The electronic system of claim 19, wherein the asymmetric write data interface is configured to operate according to a dual data rate (DDR) methodology.

23. The electronic system of claim 19, wherein at least one of the asymmetric read data interface and the asymmetric write data interface is configured to operate according to a quad data rate (QDR) methodology.

24. The electronic system of claim 19, further comprising at least one of a command and address bus coupled between the memory controller and the memory device.

25. A method of accessing data in a memory device, comprising:
writing data from a memory controller over an asymmetric write data interface of a write bus width to a memory device;
storing the data in the memory device; and
reading the data from the memory device over an asymmetric read data interface of a read bus width to the memory controller, the write bus width being different from the read bus width,
wherein the asymmetric read data interface and the asymmetric write data interface transfer the data according to different multi data rate methodologies.

26. The method of claim 25, wherein reading includes reading the data from the memory device over an asymmetric read data interface wherein the read bus width is greater than the write bus width.

27. The method of claim 25, wherein reading the data includes reading the data according to a dual data rate (DDR) methodology.

28. The method of claim 25, wherein writing data includes writing the data according to a dual data rate (DDR) methodology.

29. The method of claim 25, wherein at least one of writing and reading the data occurs according to a quad data rate (QDR) methodology.

* * * * *